United States Patent [19]

Foreman et al.

[11] 4,044,244

[45] Aug. 23, 1977

[54] AUTOMATIC TESTER FOR COMPLEX SEMICONDUCTOR COMPONENTS INCLUDING COMBINATIONS OF LOGIC, MEMORY AND ANALOG DEVICES AND PROCESSES OF TESTING THEREOF

[75] Inventors: Steven H. Foreman, Manassas; Ernest H. Millham; James E. Ortloff, both of Warrenton; Ronald Jay Prilik, Annandale, all of Va.

[73] Assignee: International Business Machines Corporation, Armonk, N.Y.

[21] Appl. No.: 712,303

[22] Filed: Aug. 6, 1976

[51] Int. Cl.² ..................... G06F 11/00; G01R 15/12
[52] U.S. Cl. ......................... 235/153 AC; 324/73 R; 235/150.5
[58] Field of Search .... 235/153 AC, 153 R, 153 AK, 235/153 A, 150.5; 324/73 R, 73 AT; 340/172.5

[56] References Cited

U.S. PATENT DOCUMENTS

| | | | |
|---|---|---|---|
| 3,622,876 | 11/1971 | Ure et al. | 324/73 R |
| 3,816,813 | 6/1974 | Jehu | 324/73 R |

*Primary Examiner*—Joseph F. Ruggiero
*Attorney, Agent, or Firm*—John E. Hoel; J. C. Redmond, Jr.

[57] ABSTRACT

Logic and analog functions in a complex semiconductor component are stuck fault and parametrically tested through an analog/digital measurement adapter coupled to logic and analog testers. Both logic and analog testers are under computer control whose purpose is to direct the testing sequence, log test results, perform algorithmic calculations on the data and diagnose failing devices in the component under test. The adapter provides the electrical environment to match a range of components under test to the logic and analog testers. The adapter is also under computer control to permit impedance matching of a multiplicity of digitally controlled stimulus/response units connected through a multiplexor to the range of components under test.

16 Claims, 29 Drawing Figures

| HEX-DEC. "ROS" CHARACTER | FUNCTION | FIG. NO. |
|---|---|---|
| 0 | CUT PIN TO LOGIC TESTER (DIRECTLY) | 6 |
| 1 | CUT PIN TO AMU (1:1 BUFFER AMP) | 7 |
| 2 | CUT PIN TO AMU (10:1 BUFFER AMP) | 8 |
| 3 | CUT PIN TO AMU (1:1 BUFFER AMP) | 9 |
| 4 | CUT PIN TO LOGIC TESTER (1:1 BUFFER AMP) | 10 |
| 5 | CUT PIN TO LOGIC TESTER (10:1 BUFFER AMP) | 11 |
| 6 | CUT PIN TO LOGIC TESTER (1:1 BUFFER AMP) | 12 |
| 7 | CUT PIN TO (OPEN CIRCUIT) | 13 |
| 8 | CUT PIN TO LOGIC TESTER (POS. COMMON I/O) | 14 |
| 9 | CUT PIN TO AMU (DIRECTLY) | 15 |
| A | CUT PIN TO (GROUND) | 16 |
| B | CUT PIN TO "MEASUREMENT" V/I (DIRECTLY) | 17 |
| C | CUT PIN TO "MEASUREMENT" V/I & LOGIC TESTER | 18 |
| D | CUT PIN TO AMU (WITH 50Ω-TO-GND) | 19 |
| E | "ZERO" OFFSET TEST (OF 1:1 BUFFER AMP) | 20 |
| F | CUT PIN TO LOGIC TESTER (NEG. COMMON I/O) | 21 |

FIG. 5

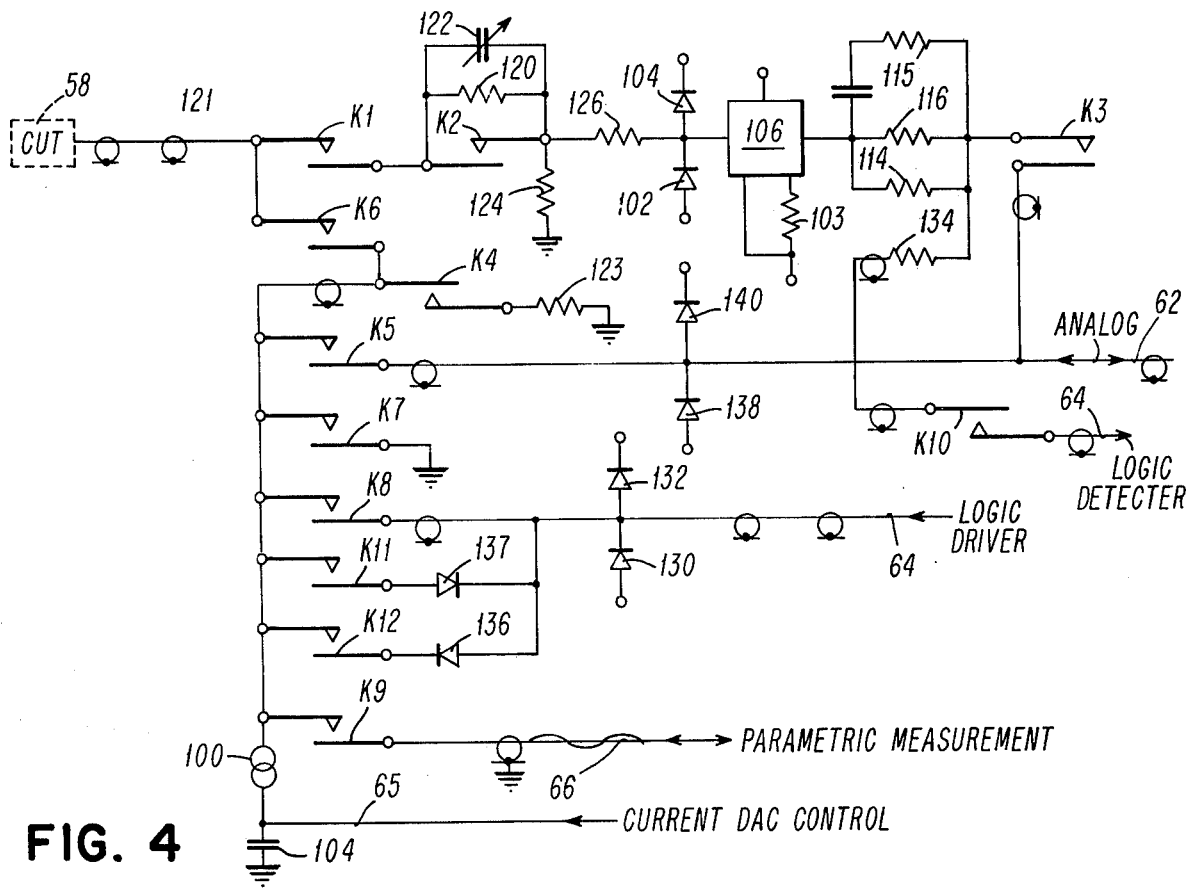

FIG. 4

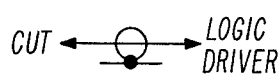
FIG. 6
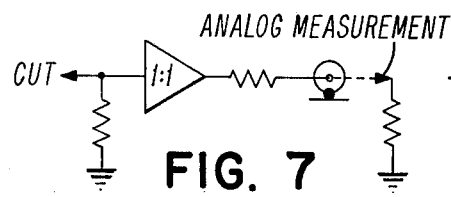
FIG. 7
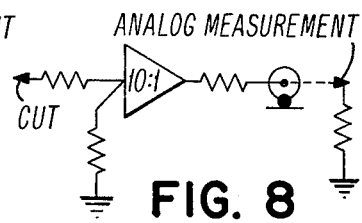
FIG. 8
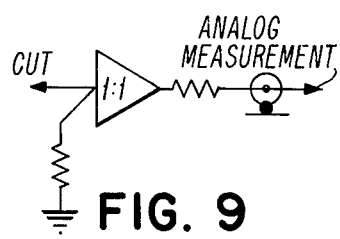
FIG. 9
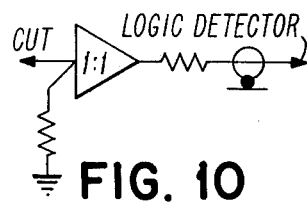
FIG. 10
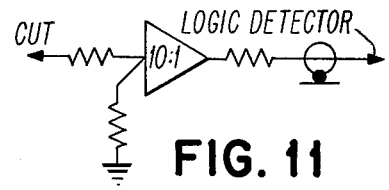
FIG. 11
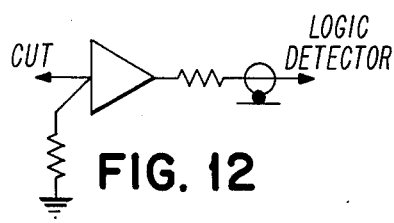
FIG. 12
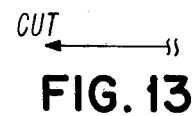
FIG. 13
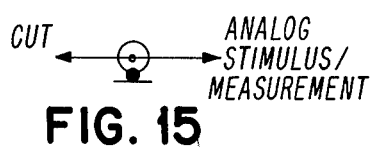
FIG. 15
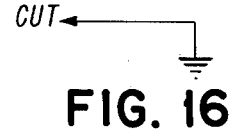
FIG. 16
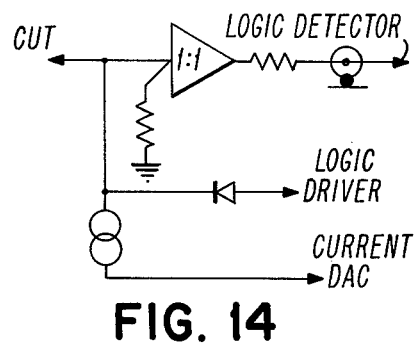
FIG. 14
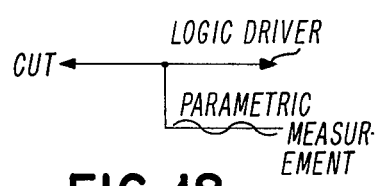
FIG. 17
FIG. 18
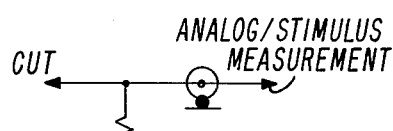
FIG. 19
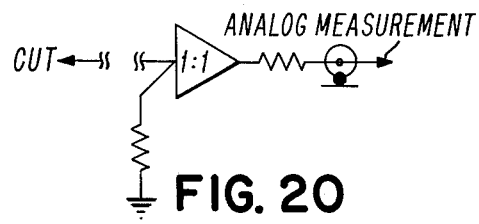
FIG. 20
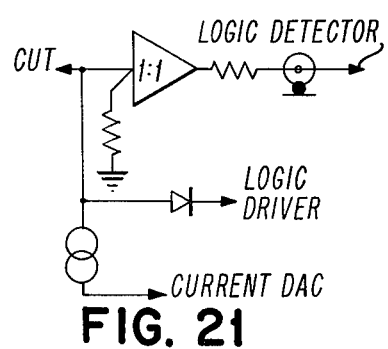
FIG. 21

| | 1 | 2 | 3 | 4 | 5 | 6 | 7 | 8 | 9 | 10 | 11 | 12 |
|---|---|---|---|---|---|---|---|---|---|---|---|---|
| IN 1 | A | A | A | A | B | B | B | B | B | B | B | B |
| IN 2 | A | A | A | A | B | B | B | B | B | B | B | B |
| IN 3 | B | B | B | B | A | B | A | B | B | B | B | B |
| CLK 1 | A | A | A | A | B | B | B | B | B | B | B | B |
| CLK 2 | A | A | A | A | B | B | B | B | B | B | B | B |
| C I/O 1 | 0 | 0 | 0 | 1 | 1 | B | B | B | B | B | 1 | 1 |
| C I/O 2 | 0 | 0 | 1 | 1 | 1 | B | B | B | B | B | 1 | 1 |
| C I/O 3 | 0 | 1 | 1 | 1 | 1 | B | B | B | B | B | 1 | 1 |
| C I/O 4 | 1 | 1 | 1 | 1 | 1 | B | B | B | B | B | 1 | 1 |
| OUT 1 | X | X | X | X | T | X | T | V | X | X | X | X |
| OUT 2 | X | X | X | X | X | X | X | X | X | F | X | X |
| OUT 3 | X | X | X | X | X | X | X | X | V | X | X | X |

TEST CYCLE

RAMP CONTROL

VOLTAGE CONTROL

FREQUENCY CONTROL

AUTOMATIC TESTER FOR COMPLEX SEMICONDUCTOR COMPONENTS INCLUDING COMBINATIONS OF LOGIC, MEMORY AND ANALOG DEVICES AND PROCESSES OF TESTING THEREOF

BACKGROUND OF THE INVENTION

A. Field of the Invention

This invention relates to testing apparatus and methds of operation. More particularly, the invention relates to testing and processes of testing complex semiconductor components including logic and analog functions.

B. Description of the Prior Art

Traditionally, semiconductor components include either analog or digital functions, but not both types of functions. Testing of analog functions generally requires complex stimulus signals such as provided by pulse generators, function generators, frequency synthesizers, and the like. Similarly, complex measurement apparatus such as capacitance meters, gain/phase meters, waveform analyzers, and the like, are required to test the component incorporating analog functions.

Digital logic functions, in contrast, simply require sequences of binary 1's and 0's or bit patterns to test the digital function in a component. The digital response is compared to an expected response to verify the function.

Computer operated test apparatus for digital and analog functions, as represented by U.S. Pat. No. 3,492,572 and Hewlitt Packard network analyzer (HP) 3042A or 8507A and the like, respectively, subject a component to a sequence of tests under program control. Such testers are also conditioned to vary the tests according to the component to be tested.

Integrated circuit technology, particularly large scale integration, is moving in the direction to incorporate both analog and digital functions in the same component. In particular, monolithic circuits for driving displays require logic functions for selection and analog functions for driving the displays. Testing of components incorporating digital and analog functions is time-consuming and expensive where separate logic and analog testers are utilized. The combination of an analog and digital tester under computer control in a single test apparatus is not a straight-forward engineering exercise. A number of problems must be overcome to merge a digital and analog tester in a single test apparatus. Among these problems are impedance matching a plurality of stimulus/measurement units to a plurality of semiconductor products. Another problem is adapting the tester to appropriately AC and DC load, a variety of semiconductor products without impacting the performance of the product. Stated another way, an analog/logic tester must be arranged to test a variety of semiconductor products without affecting the performance of the product or the capacity of the tester to conduct the various tests. There are testers for digital-to-analog and analog-to-digital components, as evidenced by U.S. Pat. No. 3,816,813 issued June 11, 1974, but such testers are not adapted to perform a variety of digital and analog tests as required by operational amplifiers, oscillators, combinatorial and sequential logic circuits. There are also testers that include adapter cards for providing different test conditions to a digital component, as described in U.S. Pat. No. 3,622,876. Such testers do not match tester and component impedance, for a variety of digital and analog tests and a range of components.

SUMMARY OF THE INVENTION

A general object of the invention is an automatic tester for electrical circuits incorporating logic and analog functions.

Another object is a computer controlled tester for semiconductor components incorporating digital and analog functions.

Another object is an analog/digital test apparatus that permits sequential digital and analog test to be performed on a component without impact to the performance of the component or the analog and digital testers.

Another object is an analog/digital test apparatus which does not require a component under test to be located adjacent to the majority of the test apparatus.

Another object is an analog measuring unit that is computer controlled to (a) multiplex a plurality of analog stimuli and measurements units to a semiconductor component under test and (b) process the test data.

Another object is an analog/digital adapter network which is under computer control to select and provide an appropriate impedance matching network between a tester and a component under test.

Another object is a process of testing electrical circuits incorporating analog and digital functions.

In an illustrative embodiment, a digital or logic tester and an analog tester or measuring unit are multiplexed to a semiconductor component under test (CUT), through a multiplexor unit and analog/digital adapter or interface network. The testers are computer controlled through an appropriate program controller, a portion of which selects the logic tests and another portion of which selects the analog tests. The logic tester includes power supply and driver/detector that are appropriately program controlled to place a correct potential and current levels on the pins of the component under test. An analog multiplexor in the analog measurement unit is also computer controlled to select the appropriate stimulus and measurement units for the component under test. The analog/digital or measurement adapter is program directed and responds to the multiplexor and pin potentials to exercise the component under test. The test results are passed to the logic and analog testers for processing and test analysis. The measurement adapter through matrix selection, isolation components and packaging permits logic drivers and analog signal drivers to be connected to the device under test from a remote location while maintaining signal integrity. A first matrix and the measurement adapter connects and disconnects logic drivers to the component under test and provides programmable loading capabilities. A second selection matrix connects and disconnects analog signal drivers to the device under test and selects proper termination. A third selection matrix connects and disconnects a voltage follower circuit to drive analog instrumentation and logic detectors and is adapted to alter the test impedance level from 50 to 75 ohms. A 50 megahertz bandwidth is achieved for the tester and minimum capacitive loading, placement and packaging of components and wiring to isolate interactive component effects. Matrix selection control is provided by a read only memory which reduces control line requirements and simplifies programming.

A feature of the invention is an analog multiplexor that is program directed to connect stimulus and measurement units, in proper sequence, to a component under test for testing of analog functions included in the component.

Another feature is an analog measuring unit which includes a multiplexor and an alterable stimulus and measurement unit, the multiplexor and stimulus and measurement unit all being under a program control for appropriately testing and measuring, in the proper sequence, the analog functions incorporated in a component under test.

Another feature is an analog measurement adapter responsive to the analog measuring unit, program control and appropriate current levels and voltage potentials for application of logic and analog test to a component under test with minimum impact to the performance of the component or the testing circuits.

Another feature is an alterable memory in the adapter, the memory defines the operating status of the adapter to achieve program control for signal integrity between a component under test and a digital and/or analog tester with minimum impact to the performance of the component under test or to the testers.

BRIEF DESCRIPTION OF THE DRAWINGS

FIG. 4 is an electrical schematic of an adapter or buffer circuit included in FIG. 1, there being one for each pin of the cut.

FIG. 5 is a table of hexadecimal codes available to control the adapter of FIG. 4.

FIGS. 6 through 21 are electrical schematics of connections available from the adapter of FIG. 4 to connect a component under test to the tester of FIG. 1.

FIG. 28a describes the data flow from the CPU to the tester.

FIG. 28b describes the data flow to the CPU from the tester.

TABLE OF CONTENTS 1.0 General System
  1.1 Component Description
  1.2 Central Processing Unit (CPU)
  1.3 Logic Control
  1.4 Analog Control Unit
  1.5 Multiplexors
  1.51 Multiplexor Operator
  1.6 Adapter
  1.61 Adapter Operator
  1.62 Adapter Relay Selection
  1.7 Control and Data Bus
  1.71 Data/Address/Control Bus
  1.72 Logic Driver/Detector
  1.73 Measurement Busses
  1.8 System Operations
2.0 Analog Measuring Unit
3.0 Logic Tester
4. Tester Operation
  4.1 Test Device
  4.2 Set-up
  4.3 Test Cycle

DESCRIPTION OF THE PREFERRED EMBODIMENT

1.0 General System

Figure 1:
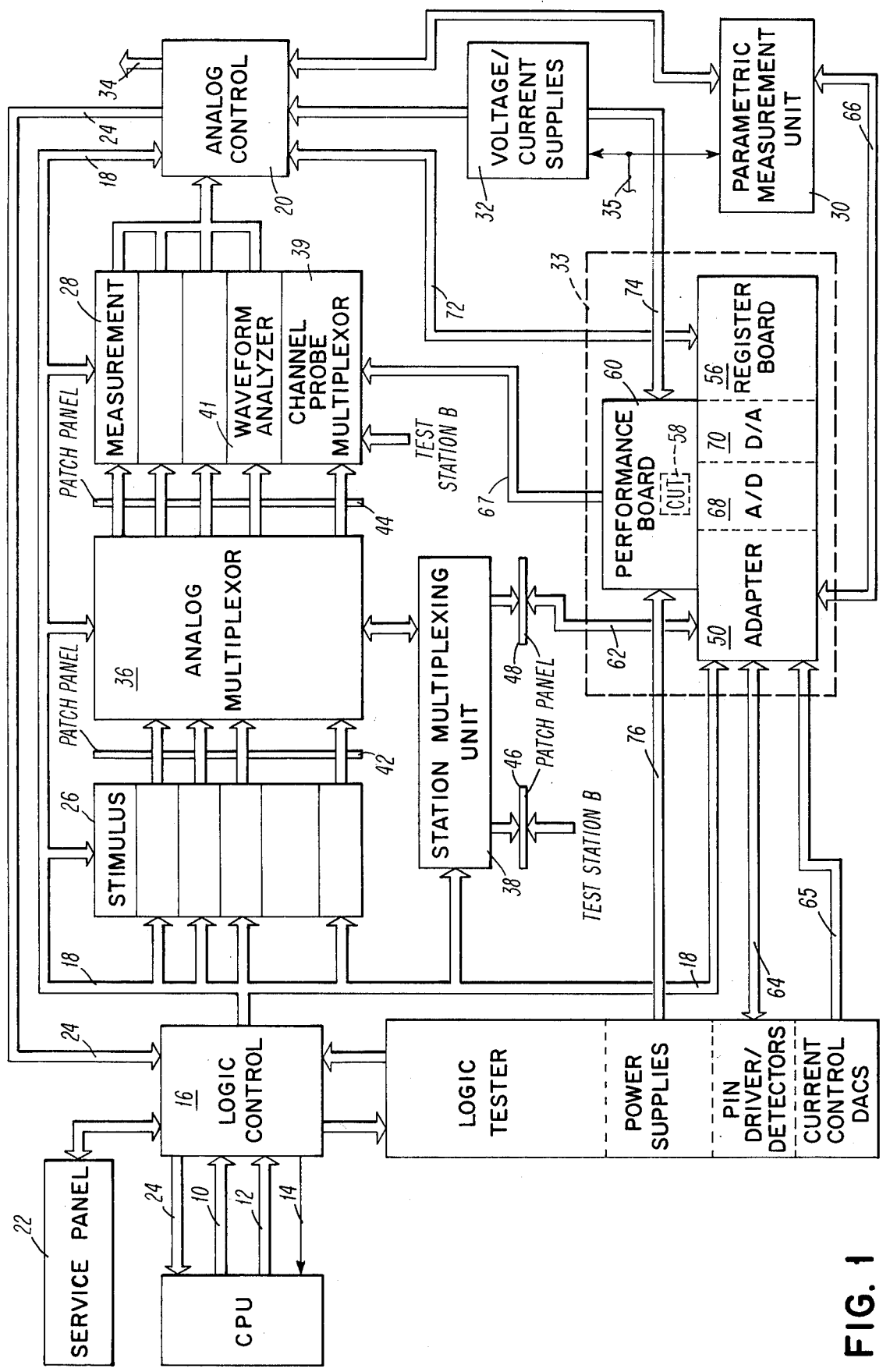
FIG. 1 is a schematic of the information flow in a combined digital and analog tester practicing the principles of the present invention.

In FIG. 1, a central processing unit including appropriate storage and I/O adapters, are connected through data bus 10, address bus 12 and an interrupt bus 14 to a logic control 16. A data/address/control bus 18 connects the unit 16 to an analog control unit 20, stimulus/measurement units 26, 28, voltage/current supplies 32, multiplexor 36, and adapter 50. The logic unit 16 also communicates with a service panel 22.

The instruction output from the CPU to the test system is shown in FIG. 28a and the test system response to the CPU is shown in FIG. 28b. Lines 10, 12, 14 and 24 are part of the CPU Input/Output (I/O) bus. Line 10 outputs the instrument data field to supply operating parameters to the testing instruments 26 and 28 and the buffer circuit data field to selectively actuate the relays in the adapter 50. Line 12 outputs the analog/logic select field to select whether the analog tester on the logic tester is to be employed, the instrument select field which identifies which testing instrument 26 or 28 is to accept the instrument data field, and the CUT Pin select field which identifies to the multiplexor 36, which pin is to be tested for the CUT. The tester then outputs to the CPU the measurment data field which gives the results of the test and the interrupt field which specifies CPU services desired.

The stimulus unit 26 includes well known signal generation circuitry, as for example, pulse generators, function generators, frequency synthesizers or other testing instruments which are digitally controlled from the unit 16. Similarly, a measurement unit 28 includes well known network analyzer circuits, as for example, capacitance meters, gain/phase meters, waveform analyzers, and the like, that are controlled by unit 16.

Measurement unit 28 provides measurement type testing instruments having outputs to the analog control logic 20. Additional inputs to the unit 20 are from a parametric measurement unit 30, a test station 33 and voltage/current supply 32. Besides providing an input to the control logic 16 over bus 24 the unit 20 also provides analog measurements over a bus 34 to a digital to analog converter incorporated in a logic tester.

The analog multiplexor 36 is program controlled from the unit 15 to coordinate the application of stimulus and measurement units to the test station 33. A station multiplexing unit 38 is also program directed from the unit 16 and permits the multiplexor to serve other test stations over other channels. Appropriate path panels 42, 44, 46 and 48 are available to an operator to reconfigure the multiplexor, stimulus, measurement and station channels, respectively.

Test station 33 includes the adapter unit 50, analog to digital 68, digital to analog converter 70, and a register board 56. A component under test 58 is connected through a performance board 60 for coupling the component to the testers. The adapter 50 is responsive to the bus 18 and the multiplexor 36 through channel 62. The adapter is also connected through an appropriate bus 64 to a power supply which is adapted to set logic driver and detector levels under program control. The parametric measurement unit 30 is adapted to be connected through a bus 66 to the adapter 50 to record the measurement at the particular terminals of the component 58. A standard analog-to-digital unit 68 and a digital-to-analog unit 70 are included in the test station to provide very accurate and direct conversion of analog signals from digital signals to and from the component 58 under test. The register board 56 is adapted to receive special outputs from the component 58 and store or transfer the data to the analog select unit 20 over a special bus 72, store and convert digital data from the analog select unit 20 to the component 58.

The terminals of the component under test are adapted to be connected through the board 60 and a bus 74 to the bias supplies 32 and through a bus 76 to the power supplies in the logic tester.

The adapter 50 is programmable to accept a single character instruction on a 16-bit bus 18 from unit 16 which, in turn, is loaded from the central processing unit (CPU) via data 10 and address bus 12.

The central processing unit is preprogrammed with a set of instructions to perform mixed sets of analog and logic testing of the component 58. All instructions on the central processing unit are single bus sets of address and data setting conditions in the units 16 and 20. Data representing test results are returned to the central processing unit from the units 16 and 20 via data buses 24 and 34 which are keyed by interrupt signals appearing on the bus 14. The signals on the interrupt bus 14 are also adapted to signal adnormal or abort conditions.

1.1 Component Description

Figure 23:
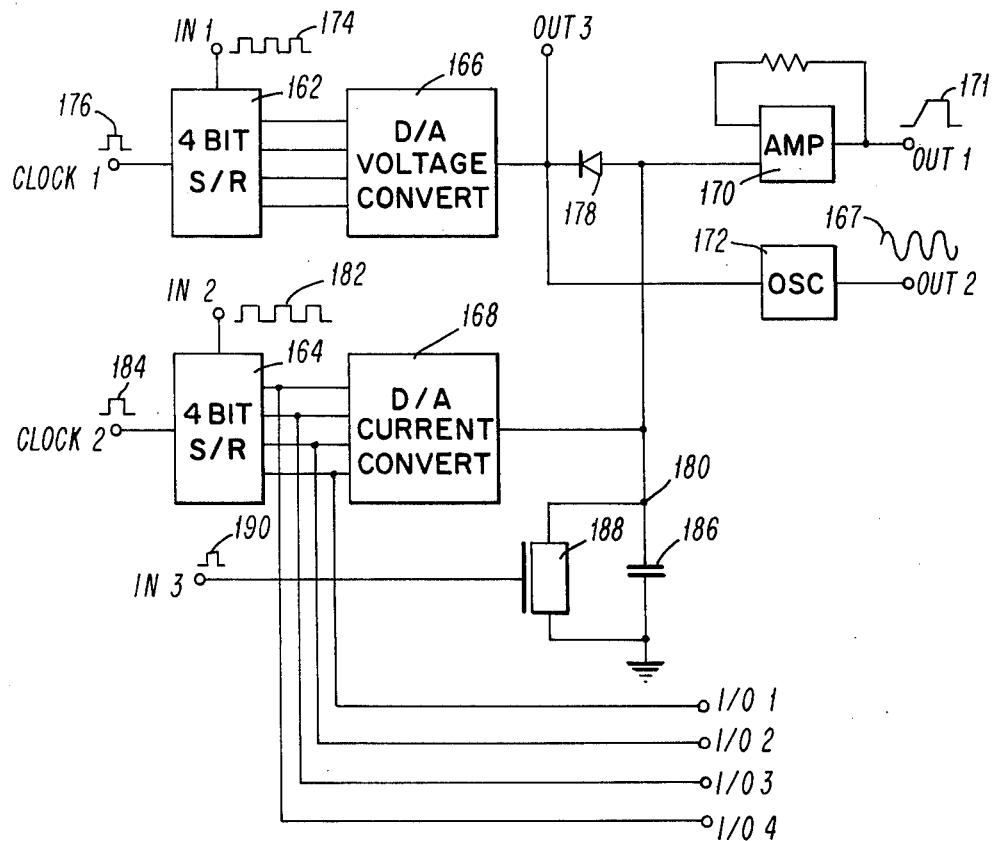
FIG. 23 is an electrical schematic of a component under test for analog and digital functions.

Analog and digital circuits suitable for incorporation in semiconductor component are described in conjunction with FIG. 23. Obviously there are analog and digital functions that may be incorporated in a semiconductor component, or for example a Gas Panel Driver as described in U.S. Pat. No. 3,896,317, assigned to the present assignee.

1.2 Central Processing Unit (CPU)

An IBM 360 Model 30 or equivalent is appropriate for the present invention. The processing unit is programmed with algorithms to direct the testing sequence; log test results; perform calculations on data measurements and diagnose failing components. Programming languages are available to permit the central processing unit to direct the tester through selected test sequences. Alternatively, commercial suppliers have programming packages available to achieve the desired test practices and sequences.

1.3 Logic Control

The logic control 16 or instrument decoder has a primary function of accepting an input word having sixteen bits of address and sixteen bits of data and, in accordance with the address value, route the data portion to the corresponding stimulus unit 26 or measurement unit 28. This is accomplished by a conventional decoder and switching logic design well-known in the art. Another function of the logic control 16 is to program the multiplexors 36 and 38 to connect the correct stimulus and measurement units, in sequence, to the component under test 58. A conventional decoder and switching logic are available to translate the instructions from the central processing unit into appropriate responses by the units 36, and 38. The logic unit 16 is also adapted to receive and store measurement data from the unit 20 on the bus 24 for delivery to the central processing unit at an appropriate time. Standard registers are employed to accept and transmit the measurement data on command. Subsidiary functions can be incorporated into the logic control 16, when necessary, to perform code conversion, for example, hexadecimal to BCD between the central processing unit and the other units of the tester. It is recognized the number of address and data bits in the input word to the control logic 16 can be changed to assume the particular architectural configuration.

1.4 Analog Control Unit

The unit 20 employs standard registers to store the data from the measuring units 28. The unit 20 also accepts as input bias supplies settings for the component 58 from the voltage/current supplies 32, parametric voltage/current test from the unit 30 and digital test results stored in the registers 56 in the test station 33. Testing conditions for the units 30 and 32 are specified by control lines 35 from the logic control 16 as instructed by the central processing unit. The parametric measurement unit 30 is connected to the appropriate terminal of the component under test 58 through the measurement adapter card 50 which will be explained in more detail hereinafter. The bias supplies 32 are connected to the required terminals of the component under test by bus 74 through hard wiring on the performance board 60. Measurement data received from the units 30, 32 and 56 are stored in appropriate registers in the unit 20. On instruction from the logic unit 16, the data in the unit 20 may be delivered either to an analog measuring unit by way of a bus 34 or supplied to the central processing unit through a bus 24.

1.5 Multiplexors

The analog multiplexor 36 connects and disconnects up to sixteen analog stimulus units 26 and measurement units 28 via 48 channels to a station multiplexor 38. The multiplexor 36 and 38 are directed by the logic unit 16 to permit all 48 lines to be switched between one of two test stations A 33 or B. (FIG. 1, however, for purpose of brevity is limited to single test station operation). The 48 channels from the multiplexors 36 and 38 are connected to the adapter card 50 as will be described. The selection of the various paths through the multiplexors 36 and 38 is by program control of the logic unit 16 from the central processing unit. Features are included in the multiplexors to prevent the selection of certain paths which would cause the interconnection of a stimulus unit 36 and measurement unit 28 in a way that would cause damage to the instruments. An additional channel probe multiplexor 39 is adapted to connect probes on the board 60 to a waveform analyzer 41 incorporated in the unit 28. The waveform analyzer 41 permits sampling of waveforms containing frequency components higher than those normally accepted by the multiplexors 38 and 36.

Figure 2:
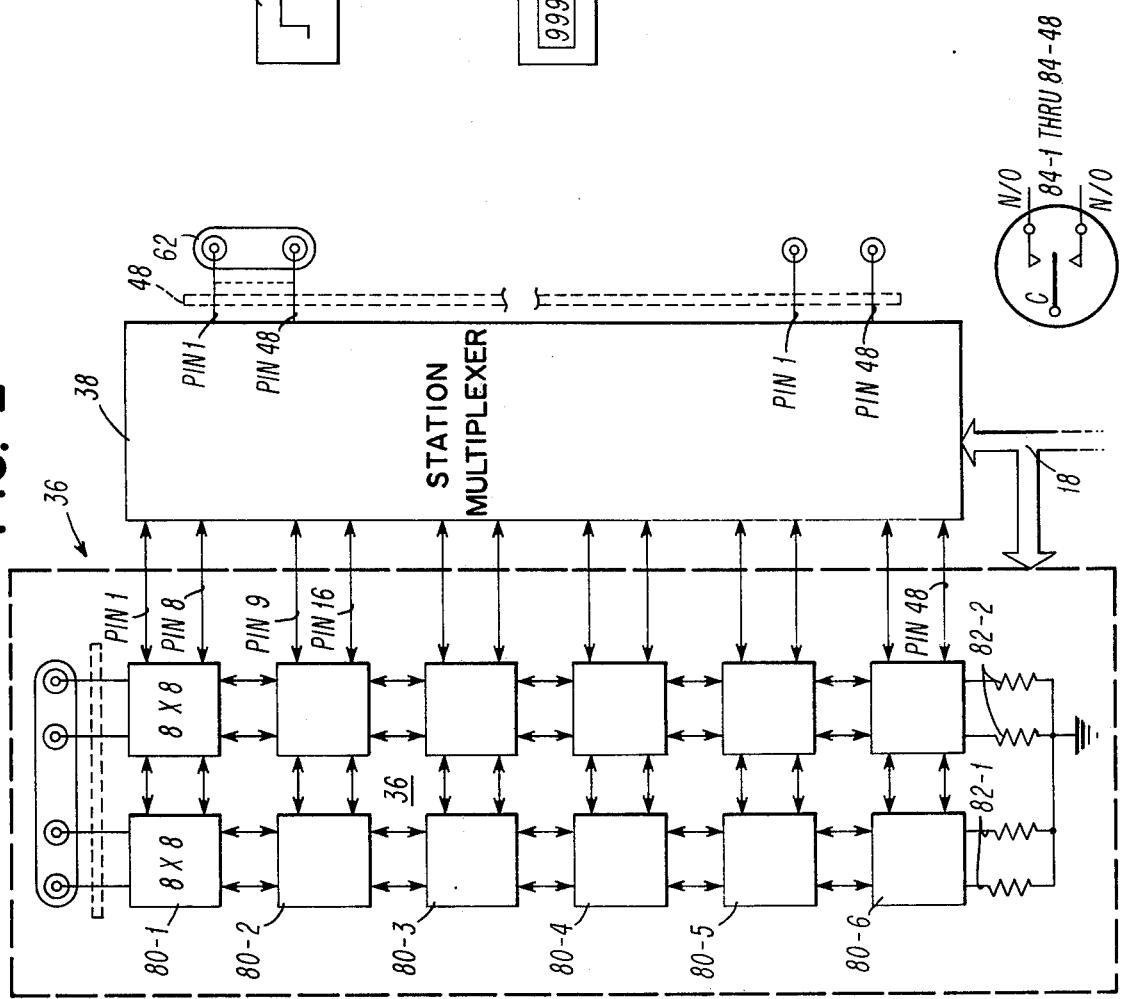
FIG. 2 is an electrical schematic of a multiplexor included in FIG. 1.

In FIG. 2, the multiplexor 36 comprises, in one form, twelve matrix modules arranged in six groups of two modules, each group designated 80-1 to 80-6. The eight outputs from the 6 groups are supplied to the station multiplexor 38 and each represent an input to the component under test. The modules in each group are multiplexed together and coupled to the other groups to form a column, one end being terminated by appropriate impedances 82-1 and 82-2 and the other end being connected to the stimulus 26 and measurement 28 units through appropriate patch panels 42 and 44.

The forty-eight outputs from the multiplexor 36 are provided as inputs to the station multiplexor 38. Each input is connected to a set of relay contacts, as shown in the inset figure, and designated 84-1 to 84-48. The relay sets are controlled from the control bus 18 to select the channel lines which are to be supplied to the test stations A or B and the analog multiplexor 36 configuration. It should be apparent that the relay configurations could be changed to permit outputs to more than two test stations. The outputs from the multiplexor 38 are supplied through an appropriate patch panel 48 for application to the measurement adapter card 50 by way of a 48-channel bus 62.

1.51 Multiplexor Operation

Figure 3:
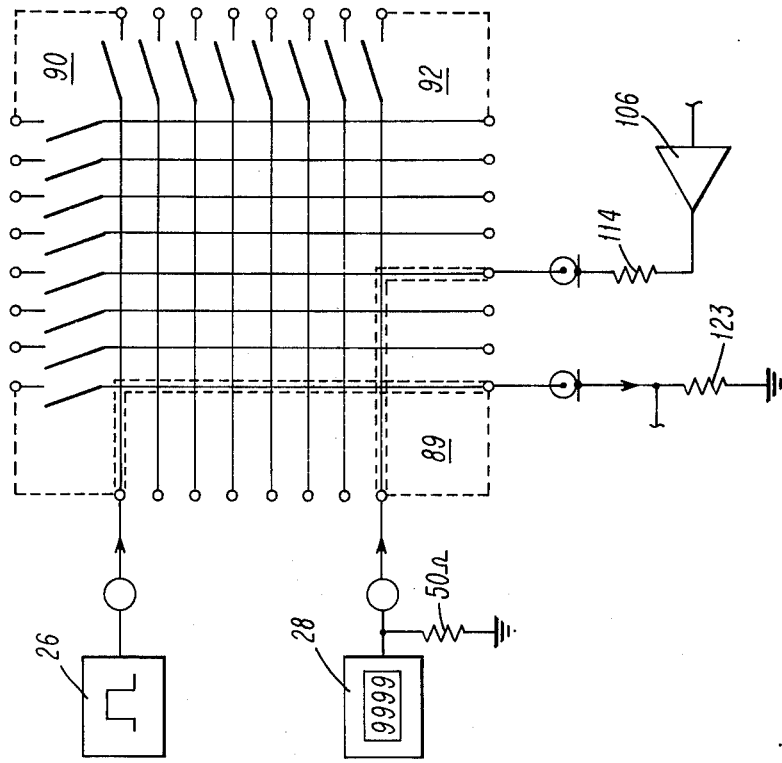
FIG. 3 is an electrical schematic of a portion of the multiplexor shown in FIG. 2.

Each multiplexor module, as shown in FIGS. 2 and 3, is coaxially coupled to a stimulus unit 26 and/or measurement unit 28. The multiplexor module is also coaxially coupled to the measurement adapter 50 represented by the termination circuit 123 and the amplifier 106 and resistor 114. Each crosspoint in the matrix 89 is adapted to provide a 50 ohm impedance level. The instruction provided on the 16-channel control bus 18 sets the impedance connections of the matrix. One portion of the control bus is adapted to selectively open normally closed switches 90 and the other portion of the control bus 18 is adpated to selectively open normally closed switches 92. The opened switches maintain the electrical integrity of the connected signal paths through the matrix while keeping unterminated stubs to a minimum length. In one form, the minimum length of unterminated stub is approximately four inches, thereby reducing spurious reflections of high frequency signals.

The multiplexor 36 responds to instructions on the bus 18 to select the appropriate stimulus and measurement units for connection to the appropriate multiplexor module 80-1 to 80-6. A subsequent instruction on the control bus 18 selects the appropriate normally closed switches 90 and 92 to coaxially connect the stimulus and response units through the multiplexors 36 and 38 and the adapter card to the component under test. The multiplexor 36 is appropriately activated by the instructions on the control bus 18 to permit test units to function without damage to each other.

1.6 Adapter

In FIG. 4, the component under test 58 is connected through the special performance board 60 and a very short length of 50 ohm coaxial cable 121, as a first input to the adapter or buffer circuit 50. The analog multiplexors 36 and 38 are connected through 50 ohm coaxial cable 62 as a second input to the adapter. Logic drivers and logic detectors are connected through 75 ohm coaxial cable by way of the bus 64 as a third input to the adapter. A current source/sink 100 is included in the measurement adapter. The source/sink 100 is controlled by a digital-to-analog converter in the logic tester (not shown) by way of the conductor 65. A capacitor 104 decouples the digital-to-analog converter to minimize noise effects. The parametric measuring unit 30 (FIG. 1) is connected via shielded twisted pairs of 66 to the adapter.

A voltage divider network comprises an RC network 122 and resistor 124. The network 122 compensates for stray capacitance effects presented to the amplifier 106 by the cable 121 and wiring. The divider is connected to the input of an output amplifier 106 through an overload protection resistor 126.

The output amplifier is protected against damaging voltage surges by diode pairs 102 and 104. The amplifier has a zero offset when trimmed by resistor 103. A 50 ohm resistor 114 causes the amplifier output impedance to match the impedance of the multiplexor cable 62. A resistor 116 trims the amplifier to unity taking into consideration of amplifier d.c. output impedance and the 50 ohm coaxial line d.c. line loss. An RC network 115 peaks the amplifier at high frequency response and droop caused by coaxial insertion losses into a 50 ohm terminator (not shown).

A plurality of relays K1-K12 are arranged to connect the component under test 58 to the analog multiplexor 36, the parametric unit 30 (FIG. 1) and/or the logic tester. The relays are programmed from the control bus 18 via a hexadecimal character which is stored in an appropriate register (not shown) in the adapter. FIG. 5 shows the functions obtained from a character loaded into the register. The function will be described in more detail in connection with the description of the FIGS. 6-21.

1.61 Adapter Operation

Returning to FIG. 4, the relays K1-K12 may be arranged into at least four different matrices. A first matrix comprising relays K6, K8, K11 and K12 disconnect the logic drivers connected to bus 64 from the component under test. The logic drivers are programmably driven as will be explained hereinafter. A second matrix comprising relay K5 and K6 connects and disconnects the component under test to the analog multiplexor by way of the bus 62. A third matrix comprising relays K3 and K10 connects and disconnects the amplifier 106 to the multiplexor bus 62 as well as the logic detector bus 64.

The operation of the relays K1-K12 will now be described in conjunction with FIGS. 6-21 to achieve desired interconnections between the channel under test and the analog/logic tester.

Relays K6 and K8 are operated to connect the component under test to the logic tester, by way of the bus 64, as shown in FIG. 6. A pair of diodes 130 and 132, as shown in FIG. 4, protect the logic driver against damaging voltage surges.

The input to amplifier 106 may be caused to be 1 megohm for connection to the bus 62 by selecting relays K1, K2, and K3 as shown in FIG. 7.

Operation of relays K1 and K3 provides a buffered connection between the component under test and the analog multiplexor bus 62 with 50 ohm source, as shown in FIGS. 7 and 8. Not selecting K2 changes the divider to a 10:1 ratio instead of the 1:1 ratio as shown in FIG. 7.

The input to the amplifier 106 from the component under test may be caused to be 50 ohms by operating relays K1, K2, K6 and K4, as indicated in FIG. 9. The amplifier 106 may be coupled to the 50 ohm analog multiplexor bus after operation of relay K3.

Operation of the relays K1, K2 and K10 connects the component under test to the 75 ohm driver/detecter bus 64, as shown in FIGS. 10 and 11. A resister 134 causes the output of the amplifier 106 to match the line 64.

Operation of the relays K1, K2 and K10 connects the component under test to the 75 ohm driver/detecter bus 64, as shown in FIG. 11 providing a 10:1 divider.

Operation of the relays K1, K6, K4 and K10 connects the component under test to the 75 ohm driver/detecter bus 64 and terminates the component in 50 ohms as shown in FIG. 12.

The component under test may be connected to an open circuit condition by selecting no relays as shown in FIG. 13.

The component under test may be connected in a common input/output configuration enabling simultaneous driving and detecting of test terminals. The circuit configuration, shown in FIG. 14 represents a positive dotting function attained by operation of the relays K1, K2, K6, K10 and K12 and by programming the current source 100 via bus 65 to a specified sink value. As an example, this configuration is useful when the output of the component under test is from the collector of a grounded emitter PNP transistor. In this case, a signal may be imposed on the component under test output whenever the PNP transistor is turned off. When a logic driver bus 64 is switched to some value equal to or more negative than the component under test output, then the terminal will represent the state of the component under test. Current will be provided for the current sink 100 by component under test, when on, and through a diode 136 by the logic driver bus 64 when the component under test is off. When the logic driver is switched to some value more positive than or equal to the component under test output, then current for the current sink 100 is provided by the logic drive bus 64 and the component under test output will remain in the most positive level as long as the logic drive conditions exist.

Operations of relays K6 and K5 provide a direct connection between the multiplexor bus 62 and the component under test as shown in FIG. 15. A pair of diodes 138 and 140 provides protection against damaging voltage surges.

Operation of the relays K6 and K7 connects the component under test directly to ground as illustrated in FIG. 16.

The component under test may be connected to the parametric measurement bus 66 by operating relays K6 and K9, as shown in FIG. 17, which allows typical force/measurement parametric test to be conducted.

Operation of the relays K6, K8 and K9 connects the component under test to the logic driver bus 64 and the parametric measurement bus 66, as shown in FIG. 18. The connection of FIG. 18 enables the measurement and self test of the logic driver.

Operation of the relays K6, K4 and K5 permits the component under test to be connected to a 50 ohm terminator and the analog line 62, as shown in FIG. 19.

With relay K3 selected, zero offset check can be performed on amplifier 106 as shown in FIG. 20.

A negative dot condition may be selected, as illustrated in FIG. 21, by operating relays K1, K2, K6, K10 and K11 and by programming the current source 100 for a specified source value. As an example, the configuration in FIG. 21 is useful when the output of the component under test is from the collector of a grounded emitter NPN transistor. In this case, a signal may be imposed on the component under test output whenever the NPN transistor is turned off by switching the logic drive line 64. When the logic drive line 64 is switched to a value equal to or more positive than the component under test output, then the test terminal will represent the state of the component under test. Current will be accepted from the current source 100 by the component under test, when on, and through the diode 137 when the component under test is off. When the logic drive bus 64 is switched to some value equal to or more negative than the component under test output, then current for the current source 100 is accepted by the logic drive bus 64. The component under test output will remain at the most negative level so long as the logic drive conditions exist.

It should be noted that the current source/sink 100 may perform multifunctions. Among these functions are a programmable current source for the component under test; compensation for leakage currents on the adapter 50, and during switching to charge stray capacitance on the measurement adapter unit. The source/sink 100 also functions with the diodes 136 and 137 to decouple the high capacitance of the driver bus 64 which allows real time switching rates.

1.62 Adapter Relay Selection

Figure 22:
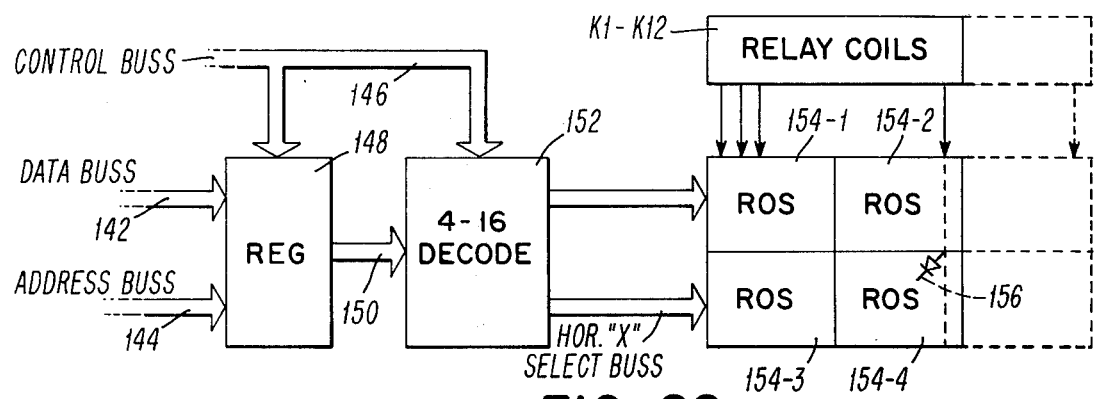
FIG. 22 is an electrical schematic of a matrix selection circuit of buffer circuit decoder for the adapter of FIG. 4.

The selection of the relays in FIG. 4 to achieve the functions of FIGS. 6 through 21 will be described in conjunction with FIGS. 5 and 22. FIG. 22 shows the buffer current decoder.

The control bus 18 (see FIG. 1) includes a data portion 142, an address portion 144 and a control portion 146 (see FIG. 22). Information on the data bus 142 describes the function to be performed by the adapter. FIG. 5 indicates the different functions by hexadecimal characters. In FIG. 22, address bus 144 loads the data into the correct register 148 included in the adapter 50 (see FIG. 1). The control bus 146 allows the data to be strobed into the registers 148. All of the information on the data bus 142, address bus 144 and control bus 146 originates from the control logic unit 16 which is driven by the central processing unit, as described in conjunction with FIG. 1.

The output from the registers 148 appears on a four bit bus 150 which is provided to a standard decoder and driver network 152. The control bus 146 also strobes the data from the register 148 into the decode/driver 152. The decode/driver 152 is connected to the relays K1 through K12 by series of alterable read only store modules 154-1 to 154-4. Each read only store is adapted to provide four of the sixteen functions set forth in FIG. 5. Each read only store is a diode matrix which has been personalized to provide four of the functions in FIG. 5. Each diode matrix is personalized by applying excess of current to those diodes not required. The excess current effectively opens the diodes which are removed from the circuit. In an illustrative example, the read only store 154-2 may be personalized to provide current for relays K4, K5 and K6 to permit the function shown in FIG. 19 to be performed by the adapter 50. The decoder/driver 152 is adapted to turn on the correct drivers to ground the appropriate diodes 156 in the read only store 154-2. When the drivers in the unit 152 are turned on the relays K4, K5 and K6 will be operated. Again, the instruction for operating the drivers in unit 152 is provided from the data bus 142 based on the addresses appearing on the bus 144 and under control of the bus 146.

As noted in FIG. 22, additional relays may be added to the adapter 50 (not shown).

1.7 Control and Data Bus (see FIG. 1)

1.71 Data/Address/Control Bus

The bus 18 or line 35 handles 16 bits and extends from the controller 16 to the multiplexors 36, 38; analog control logic 20; adapter 50; parametric measurement unit 30 and the bias supply 32. The timing on the busses are provided by appropriate circuitry included in the logic circuit.

1.72 Logic Driver/Detector

A bus 64 provides the driver and detector supplies and bus 65 provides analog for the programmable current source/sink. The bus 64 comprises coaxial cables which have the characteristic impedance in the order of 75 ohms.

1.73 Measurement Busses

There are five different measurement busses. The busses 24 and 34 extend from the analog control logic to the central processing unit and/or an analog and digital converter which may be included in the logic tester. The busses 76 and 74 are essentially voltage/current measurement circuits. The bus 67 provides direct measurement of the component under test through probes connected to a multiplexor 39.

1.8 System Operations

The operation of the test system comprises the following steps:

i. A multiplexor is disconnected and all exitation is reset.

ii. Program instructions are provided for the logic unit to set up the analog exitation.

iii. Program instruction is provided to the adaptor 50.

iv. The multiplexor is programmed into the proper configuration by instruction from logic.

v. The logic tester is operated to exercise logic terminal of the component under test.

vi. The logic detectors are operated to sample logic output and compare the responses with the anticipated results.

vii. Provide clock pulses on the bus 18 to trigger appropriate analog stimulus instruments to provide an input to the component under test.

viii. Perform measurement reading, involving the multiplexors 38 and 36.

ix. Transmit measurement results to the central processing on bus 24 for processing.

2.0 Analog Measuring Unit

As shown in FIG. 1, the logic control 16, stimulus 26, measurement unit 28, together with the multiplexors 36 and 38, have a two-way interconnection with the adaptor 50 from the analog measurement unit.

3.0 Logic Tester

The logic tester is similar to the tester shown in U.S. Pat. No. 3,492,572 issued Jan. 27, 1970, and assigned to the same assignee as that of the present invention. The tester in U.S. Pat. No. 3,492,572 is adapted to provide programmable current sources for line driving and other multifunctions which may be activated and coordinated through appropriate processing programming.

4. Tester Operation

4.1 Test Device

Analog and digital circuits are shown that may be included in a semiconductor component.

In FIG. 23, the test circuit includes a first shift register 162 and a second shift register 164 which are multiplexed to converter 166 and a current converter 168, respectively. The shift registers 162 and 164 and converters 166 and 168 are adapted to control a buffer amplifier 170 and oscillator 172 to obtain selected analog outputs in response to digital inputs as will be described hereafter.

The shift register 162 responds to the digital input 174 at a terminal designated $IN_1$ and a clock input 176 at a terminal designated CLK1 to provide any one of 16 different digital combinations to a converter 166. The output of the shift register 162 selects the voltage condition for the converter 166 resulting in 16 possible discrete voltage levels at an output terminal designated OUT3 and the oscillator 172. The response of the oscillator 172 to the converter 166 is to produce a different frequency 167 at a terminal designated OUT2 for each of the 16 different input voltages.

The shift register 164 responds to another set of digital signals 182 provided to a terminal designated IN2 to a clock signal designated CLK2. The output of the register 164 selects the current condition for the current converter 168 resulting in 16 possible discrete current levels at a node 180. A second function of the outputs of the shift register 164 is to allow logic verification of the shift register 164 on common input/output terminals 1 through 4 and to enable parallel entry of data into converter 168 by driving the common input/output pins when the shift register 164 is set to all 1's condition. Current from the converter 168 charges a capacitor 186 when a field effect transistor 188 is turned off until the voltage at 180 reaches the value of forward biasing the diode 178. At that time, the current from the converter 168 flows through the diode 178 into the converter 166. An amplifier 170 buffers a ramp generated at a terminal OUT1. The amplifier 170 provides a signal 171 whose origin is 0 volts and which is positive going. The slope of the ramp is solely dependent on the current from the converter 168 and capacitor 186. The voltage level from the converter 166 plus the drop across the diode 178 determines the most positive voltage at OUT1 171. A reset pulse 190 provides at the terminal designation IN3 turns on the FET 188 which discharges the capacitor 186 and causes the voltage of the node 180 to go to 0 volts. The diode 178 is reverse biased with all current from the converter 168 passing through the FET 188 to a return path. The output at terminal OUT1 will go to 0 volts with a ramp that depends on circuit response. It is apparent that the signals at the terminals IN1,2, 3 and CLK1, 2 can provide ramp control at the terminal OUT1; frequency control at the terminal OUT2 and voltage level at the terminal OUT3, as determined by the clock pulses 176, 184.

4.2 Set-Up

Figure 24:
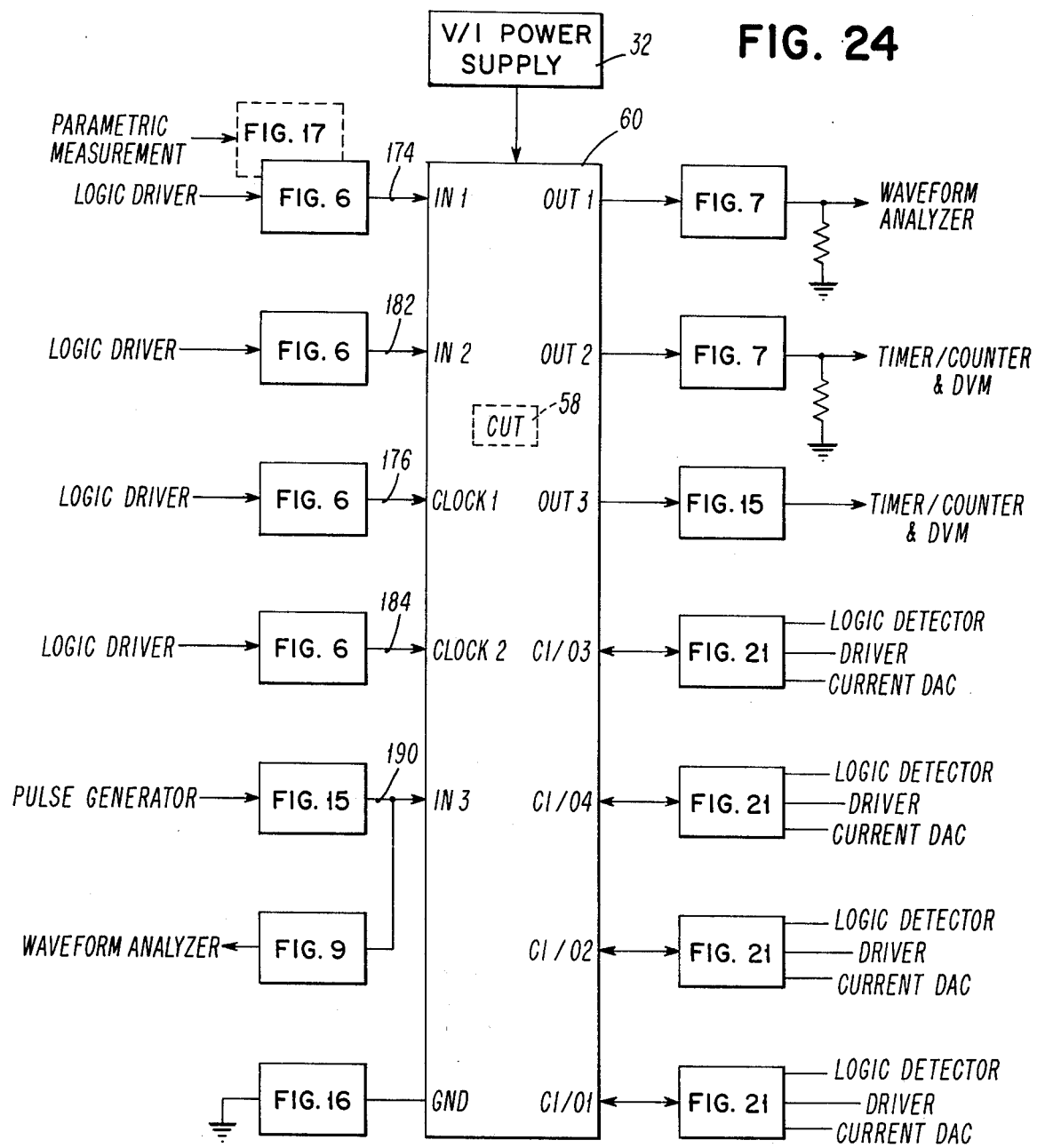
FIG. 24 is an electrical schematic of test circuits employed for testing the component of FIG. 23.

FIG. 24 shows the connection of the logic tester and analog measurement unit to the test component described in FIG. 23. The digital signals 174, 182 and the clock signals 176 and 184 are provided by the logic tester over the bus 64 of FIG. 1 to the terminals IN1, 2 and CLK1, 2. The adapter 50 (FIG. 4) is programmed to connect the terminals C I/O 1, 2, 3 and 4 through the bus 64 (see FIG. 1) to the logic tester. Relays K1, K2, K6, K10 and K11 (see FIG. 4) are selected to provide a negative dot condition or shown by FIG. 21, at the terminals C I/0 1, 2, 3 and 4. These terminals are also connected to the bus 65 (see FIG. 1) which connects to the current source (DAC) in the logic tester. The adapter connects the component under test 58 to the pulse generator in the stimulus unit 26 through the terminal IN3 and the multiplexor units 36, 38 by the setting of the relays described in FIG. 15. The waveform analyzer, included in the measurement unit 28, is connected to the terminal IN3 by the setting of relays in the adapter as described in FIG. 9.

The output terminals of 1, 2 and 3 are connected to the waveform analyzer, timer/counter/digital voltmeter, through multiplexors 38, 36. The relays on the adapter are set as described in FIGS. 7 and 15, respectively. The parametric measurement unit can be connected to any Cut I/O Pin as shown on "IN1" via FIG. 17.

The power supply 32 is programmed to activate the component 58 under test. The relays in the measurement adapter connect the component to test to ground as described in FIG. 16.

4.3 Test Cycle

Figure 25:
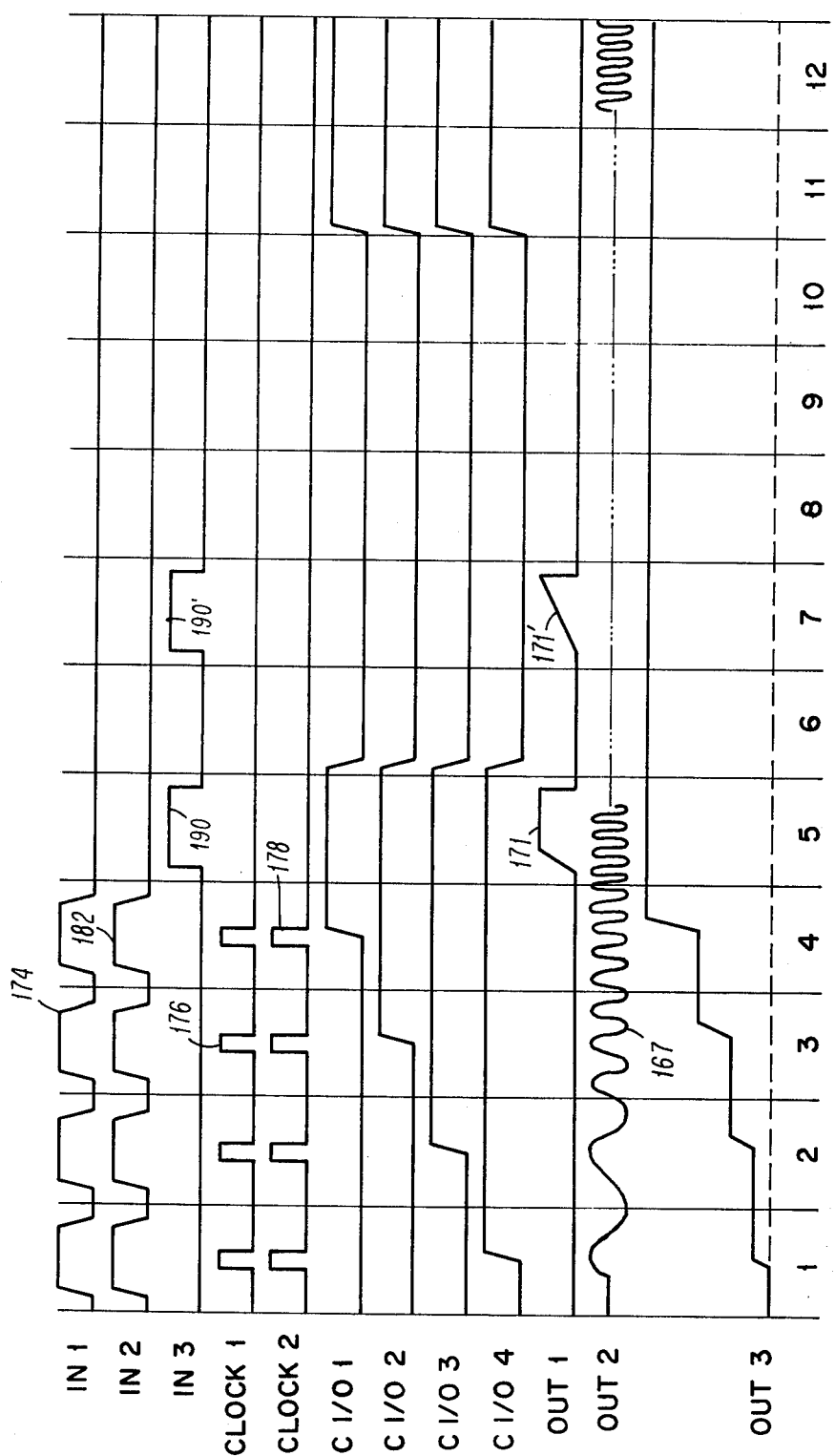
FIG. 25 is a timing diagram for those tests applied in FIG. 26.

In FIG. 25, a twelve interval test cycle, exercises the test part. In the intervals 1 through 4, the data and clock pulses are provided at the terminals IN1, 2 and CLK1, 2. The common I/O terminals 1 through 4 indicate the status of the shift register 164 (see FIG. 23) outputs as the clock or digital pulses occur at the terminals IN1, 2 and CLK1 and 2.

The voltage appearing at OUT1 is not altered by the pulses 182 appearing at IN2 while the pulses 174 at the terminal IN1 increase the output of converter 166 (see FIG. 23) as shown at terminal OUT3. The frequency 167 at OUT2 changes as shown in FIG. 25, as a result of the increasing voltage on the oscillator 172 (see FIG. 23). At test interval 5 the clock pulse 190 is provided at the terminal IN3 by the pulse generator through the adapter connection described in FIG. 15. Simultaneously, the amplifier 170 (see FIG. 23) provides a voltage ramp 171. The lack of clock pulse 190, however, discharges the capacitor 186 (see FIG. 23) which was charged by the converter 168 as described in FIG. 23. The ramp 171 terminates based on the circuit response. The frequency 167 at the terminal OUT2, however, is retained because the voltage remains up at the terminal OUT3 by reason of the continued setting of the converter 166 due to the presence of the pulses 174 in the register 162 (see FIG. 23).

The waveform analyzer in the measurement unit 28 (FIG. 1) is connected to the terminal OUT1 during the test interval 5 by the adapter connection described in FIG. 7 (see FIG. 24). The analyzer is appropriately triggered from the logic control 16 and the data accumulated for processing by way of the analog (FIG. 1).

Test interval 6 results in common I/O pins 1 to 4 being forced to a logical 0 state. The logic tester supplies the zero condition on these pins by way of the bus 64. The test interval 7 repeats the tests done in the test interval 5. The difference in the shape of the pulse 171' is compared to the pulse 171.

The test interval 8 results in the output of the pulse generator being forced to a logical one on the terminal IN3. The waveform analyzer is reprogrammed to cause the terminal OUT1 to be measured. The analyzer results are received with the central processing and compared with preset limits.

The test interval 9 results in the digital voltmeter in measurement unit 28 (see FIG. 1) being connected to the terminal OUT3. The d.c. voltage at the terminal OUT3 is measured and accumulated for processing.

The test interval 10 results in a timer/counter in the unit 28 (see FIG. 1) being connected to the terminal OUT2. A frequency measurement is conducted and the results accumulated on processing.

The test interval 11 results in logic drivers on the common I/O lines 1 to 4 being switched to a logical 1.

The test interval 12 results in a logic sample being taken on the common I/O lines 1 to 4.

Figures 26, 27:
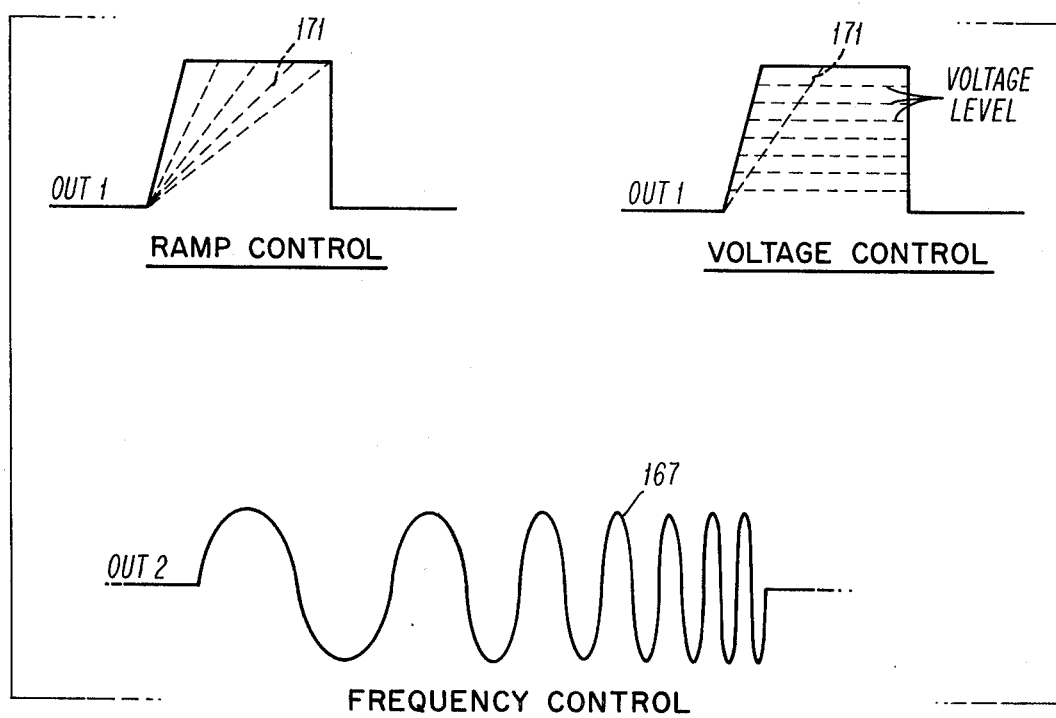
FIG. 26 is a table of logic and analog tests performed by the tester of FIG. 1 on the component of FIG. 23.
FIG. 27 is an expanded drawing of those waveforms appearing on OUT 1 and OUT 2 in FIG. 25.

FIG. 26 tabulates the digital inputs to the terminals IN1, 2, 3, 4 and CLK 1, 2 for the full 12 interval test cycle. The letters A and B in the respective time intervals indicate voltage "up" or "down" levels, respectively. The digital outputs appearing at the terminals I/O 1 to 4 are also defined in FIG. 26. The binary 1 or 0 expected at the respective terminals is indicated. The letter B indicates a forced 0 or pull down condition on these levels. The effective measurement types conducted at the terminals OUT 1, 2 and 3 are also indicated in FIG. 26. The letters F, V and T indicate Frequency, Voltage and Time measurements at the respective terminals during the test intervals. A number of other logical and analog tests and measurements may be performed on the test circuit in FIG. 23, for example, drain current, parametrics and response time, but these have been omitted for purposes of brevity.

FIG. 27 is an expanded drawing of OUT1 and OUT2 illustrating the range of digital control for the various functions.

While the invention has been particularly shown and described with reference to the preferred embodiments, it will be understood by those skilled in the art that the foregoing and other changes in form and details may be made without departing from the spirit and scope of the invention.

We claim:

1. A testing apparatus for stimulating and measuring analog properties of a circuit under test while enabling the simultaneous stimulation and measurement by a logic testing apparatus on a plurality of terminals of the circuit under test, connected to the I/O bus of a central processing unit for receiving an instruction having an address and a data component, the address component including an analog/logic selection field, an instrument selection field, and a circuit under test pin selection field and the data portion including an instrument data field and a buffer circuit data field, comprising:

an instrument decoder having an input connected to said central processing unit I/O bus;

a first testing instrument having a control input connected to an output of said instrument decoder and a second testing instrument having a control input connected to an output of said instrument decoder, said first and second testing instruments having data lines connected to said central processing unit I/O bus;

said instrument decoder generating an enabling signal to said first testing instrument in response to the receipt of a first instrument select field in a first instruction output from said central processing unit, causing said first testing instrument to generate a signal waveform on an output line, characterized by a first instrument data field in said first instruction;

said instrument decoder enabling said second testing instrument in response to the receipt of a second instrument select field in a second instruction output from said central processing unit, causing said second testing instrument to measure a second signal waveform on an input line, based upon measurement criteria specified by a second instrument data field in said second instruction;

a multiplexor having a first signal input connected to the output of said first testing instrument and a control input for receiving a component under test pin select field from said first instruction;

a first buffer circuit having an input connected to a first output from said multiplexor, which first output is connected through said multiplexor to said signal output of said first test instrument in response to a component under test pin select field in said first instruction;

a buffer circuit decoder having an input connected to said I/O bus from said central processing unit and a control input connected to said first buffer circuit, for connecting said first output from said multiplexor, through said first buffer circuit to a first terminal on said component under test in response to a buffer circuit data field in said first instruction, enabling the input of said first signal waveform to said first terminal on said component under test;

a second buffer circuit having an input connected to a second terminal of said component under test, which second terminal generates said second signal waveform which is the component under test's response to said first signal waveform;

a second buffer circuit decoder having an input connected to said I/O bus of said central processing unit and a control output connected to said second buffer circuit for connecting said second terminal of said component under test through said second buffer circuit to a second input line to said multiplexor in response to a second buffer circuit data field in said second instruction;

said multiplexor having a second output line connected to said signal input line for said second testing instrument, connected through said multiplexor to said second buffer circuit in response to a second circuit under test pin select field in said second instruction;

said second testing instrument measuring said second signal waveform generated from said second terminal of said component under test and generating a digital representation of said measurement which is output over said output line of said second testing instrument to the I/O bus of said central processing unit;

whereby a plurality of test may be performed on the component under test.

2. The apparatus of claim 2 which further comprises:

a logic tester having an input connected to said I/O bus, a stimulus output line connected to said first buffer circuit and a measurement input line connected to said second buffer circuit, for selectively carrying out digital testing of said component under test in response to said analog/logic selection field in said first and second instruction;

whereby both digital and analog tests may be simultaneously carried out on the component under test.

3. The apparatus of claim 2, wherein said multiplexor further comprises:

a plurality of elementary crossbar multiplexors with stub cutoffs, each elementary multiplexor being selectively connected to adjacent elementary multiplexors when the associeted crosspoint is not selected;

whereby spurious reflections from signal waveforms switched at a crosspoint, are reduced.

4. The apparatus of claim 2, wherein said buffer circuits further comprise:

an input/output analog line connected to said multiplexor, a logic detection output line connected to said multiplexor, a logic driver input line connected to said multiplexor, and an input/output line connected to a terminal on said component under test.

5. The apparatus of claim 4, wherein said buffer circuits further comprise:

a logic driver circuit having a first relay connected between said logic driver input line and said component under test input/output line, a second relay in series with a diode poled with its cathode towards said logic driver input line, connected between said logic driver input line and said component under test input/output line and a third relay in series with a second diode having its anode poled toward said logic driver input line, connected between said logic driver input line and said component under test input/output line;

whereby logic drivers in said logic tester can be selectively connected to a terminal on said component under test.

6. The apparatus of claim 5, wherein said buffer circuit further comprises:

a programmable current source selectively connected between said component under test input/output line and the first plate of a capacitor whose second plate is connected to ground, for selectively reverse biasing said first or second diodes, thereby isolating said terminal of said component under test from the capacitance of said logic driver input line.

7. The apparatus of claim 6, wherein said buffer circuit further comprises:

a fourth relay which selectively connects said component under test to said input/output analog line whereby analog circuit testing of said component under test may be carried out.

8. The apparatus of claim 7, wherein said buffer circuit further comprises:

a fifth relay having a buffer amplifier in series therewith connected between said input/output line of said component under test and said analog input/output line;

whereby response signals generated by said component under test may be buffered prior to measurement by said second testing instrument.

9. The apparatus of claim 8, wherein said buffer circuit decoder further comprises:

a read only storage array having an address input for receiving said buffer circuit data field and a plurality of data output signal lines connected to selected combinations of said first, second, third, fourth and fifth relays;

whereby said first, second, third, fourth and fifth relays may be selectively closed in response to said buffer circuit data field.

10. The apparatus of claim 1, wherein said digital representation of said measurement input to said central processing unit is stored with previously stored similar representations which are processed by arithmetic algorithms in said central processing unit to analyze the operational characteristics of said component under test.

11. The apparatus of claim 8, wherein said buffer amplifier output impedance matches the input impedance of said signal input line for said second testing instrument.

12. The apparatus of claim 11, wherein the input impedance of said buffer amplifier is selectively adjustable.

13. The apparatus of claim 1, which further comprises:
- a third buffer circuit having an input connected to said first terminal of said component under test, which first terminal receives said first signal waveform;
- a terminating impedance, matched to the output impedance of said first test instrument;

whereby signal reflection losses are reduced.

14. The apparatus of claim 1, which further comprises:
- a third buffer circuit having an input connected to said first terminal of said component under test, which first terminal receives said first signal waveform;
- a third buffer circuit decoder having an input connected to said I/O bus of said central processing unit and a control output connected to said third buffer circuit for connecting said first terminal of said component under test through said third buffer circuit to a third input line to said multiplexor in response to a third buffer circuit data field in a third instruction;
- said multiplexor having a third output line connected to a signal input line for a third testing instrument, connected through said multiplexor to said third buffer circuit in response to a third circuit under test pin selection field in said third instruction;
- said third testing instrument monitoring said first signal waveform received at said first terminal of said component under test and generating a digital representation of said monitored first signal waveform which is output over the output line of said third testing instrument to the I/O bus of said central processing unit;

whereby feedback control of said first test instrument can be carried out.

15. The apparatus of claim 1, which further comprises:
- a parametic testing unit having an output line for forcing a d.c. signal;
- a parametric measuring unit having an input line for measuring said d.c. signal;
- a third buffer circuit having an input connected to a third terminal of said component under test, which third terminal receives said d.c. signal;
- a third buffer circuit decoder having an input connected to said I/O bus of said central processing unit and a control output connected to said third buffer circuit for connecting said third terminal of said component under test through said third buffer circuit to said output line of said parametric testing unit and for connecting said third terminal of said component under test to said input line of said parametric measurement unit, in response to a third buffer circuit data field in a third instruction;

whereby the d.c. parametric characteristics of said third terminal can be monitored.

16. The apparatus of claim 8, wherein the input of said buffer amplifier has a selectable signal attenuator.

* * * * *